(12) United States Patent
Suzuki et al.

(10) Patent No.: US 10,770,863 B2
(45) Date of Patent: Sep. 8, 2020

(54) SEMICONDUCTOR LASER DEVICE

(71) Applicant: FURUKAWA ELECTRIC CO., LTD., Tokyo (JP)

(72) Inventors: Toshihito Suzuki, Tokyo (JP); Kazuaki Kiyota, Tokyo (JP); Go Kobayashi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/261,622

(22) Filed: Jan. 30, 2019

(65) Prior Publication Data

US 2019/0165544 A1    May 30, 2019

Related U.S. Application Data

(63) Continuation of application No. PCT/JP2017/036834, filed on Oct. 11, 2017.

(30) Foreign Application Priority Data

Oct. 12, 2016 (JP) .................. 2016-200759

(51) Int. Cl.
*H01S 5/12* (2006.01)
*H01S 5/125* (2006.01)
(Continued)

(52) U.S. Cl.
CPC .......... *H01S 5/124* (2013.01); *H01S 5/06258* (2013.01); *H01S 5/125* (2013.01);
(Continued)

(58) Field of Classification Search
CPC .... H01S 5/124; H01S 5/1231; H01S 5/06258; H01S 5/125; H01S 5/1246;
(Continued)

(56) References Cited

U.S. PATENT DOCUMENTS 4,796,273 A    1/1989 Yamaguchi
6,608,855 B1   8/2003 Hwang et al.
(Continued)

FOREIGN PATENT DOCUMENTS

JP    61-216383    9/1986
JP    2000-58961   2/2000
(Continued)

OTHER PUBLICATIONS

International Search Report dated Dec. 19, 2017 in PCT/JP2017/036834 filed on Oct. 11, 2017.
(Continued)

*Primary Examiner* — Tod T Van Roy
*Assistant Examiner* — Delma R Fordé
(74) *Attorney, Agent, or Firm* — Oblon, McClelland, Maier & Neustadt, L.L.P.

(57) ABSTRACT

A disclosed semiconductor laser device includes a distributed feedback portion serving as a light-emittable active region the distributed feedback portion having a diffraction grating; and a distributed reflective portion serving as a passive reflective mirror, the distributed reflective portion having a diffraction grating, wherein the distributed feedback portion includes a first region adjacent to the distributed reflective portion and having a diffraction grating having a predetermined standard period, a phase shift region adjacent to the first region, the phase shift region being longer by twice or more than the standard period, and a second region adjacent to an opposite side to the first region of the phase shift region and having a diffraction grating with the standard period, and the phase shift region optically changes a phase of laser beam between the first region and the second region.

5 Claims, 12 Drawing Sheets

(51) Int. Cl.
*H01S 5/0625* (2006.01)
*H01S 5/323* (2006.01)
*H01S 5/065* (2006.01)
*H01S 5/343* (2006.01)

(52) U.S. Cl.
CPC .......... *H01S 5/1215* (2013.01); *H01S 5/1218* (2013.01); *H01S 5/1231* (2013.01); *H01S 5/0654* (2013.01); *H01S 5/06256* (2013.01); *H01S 5/1206* (2013.01); *H01S 5/1246* (2013.01); *H01S 5/323* (2013.01); *H01S 5/34306* (2013.01); *H01S 2304/04* (2013.01)

(58) Field of Classification Search
CPC ............... H01S 5/34306; H01S 5/0654; H01S 5/06256; H01S 5/323; H01S 2304/04; H01S 5/1215–1218; H01S 5/1206–1218

See application file for complete search history.

(56) References Cited

U.S. PATENT DOCUMENTS

| | | | |
|---|---|---|---|
| 6,638,773 | B1 | 10/2003 | Hwang et al. |
| 2014/0211823 | A1 | 7/2014 | Nakahara et al. |
| 2015/0357792 | A1 | 12/2015 | Kobayashi |

FOREIGN PATENT DOCUMENTS

| | | |
|---|---|---|
| JP | 2014-150145 | 8/2014 |
| JP | 5795126 | 10/2015 |
| WO | WO 03/103107 A1 | 12/2003 |
| WO | 2014/126261 A1 | 8/2014 |

OTHER PUBLICATIONS

Written Opinion dated Dec. 19, 2017 in PCT/JP2017/036834 filed on Oct. 11, 2017.
Chinese Office Action dated Apr. 21, 2020 in Chinese Application No. 201780045737.7 (with English Translation).
M. Okai, et al. "Corrugation-Pitch Modulated MQW-DFB Lasers with Narrow Spectral Linewidth," IEEE Journal of Quantum Electronics, vol. 27, No. 6, Jun. 1991, pp. 1767-1772.

FIG.4

| | | | |
|---|---|---|---|
| CONVENTIONAL EXAMPLE (DFB) | STANDARD PERIOD DFB REGION | PAR REGION | STANDARD PERIOD DFB REGION |
| FIRST COMPARATIVE EXAMPLE | STANDARD PERIOD DFB REGION | PAR REGION | DBR REGION |
| FIRST EMBODIMENT | STANDARD PERIOD DFB REGION | PAR REGION | STANDARD PERIOD DFB REGION | DBR REGION |
| SECOND EMBODIMENT | STANDARD PERIOD DFB REGION | PAR REGION | STANDARD PERIOD DFB REGION | DBR REGION |
| THIRD EMBODIMENT | STANDARD PERIOD DFB REGION | REGION HAVING NO DIFFRACTION GRATING | STANDARD PERIOD DFB REGION | DBR REGION |
| FOURTH EMBODIMENT | STANDARD PERIOD DFB REGION | PAR REGION | STANDARD PERIOD DFB REGION | DBR REGION |

SEMICONDUCTOR LASER DEVICE

CROSS-REFERENCE TO RELATED APPLICATION(S)

This application is a continuation of International Application No. PCT/JP2017/036834, filed on Oct. 11, 2017 which claims the benefit of priority of the prior Japanese Patent Application No. 2016-200759, filed on Oct. 12, 2016, the entire contents of which are incorporated herein by reference.

BACKGROUND

The present disclosure relates to a semiconductor laser device.

In recent years, multilevel modulation optical communication that can increase the communication speed has been frequently used in an optical communication field. As a representative method of the multilevel modulation system, a coherent communication system using a phase-shift keying (PSK) system has been known. In the coherent communication, a local oscillator light source is required on a reception side, in addition to a signal light source on a transmission side.

In the coherent communication, because an optical phase is modulated according to a signal, reduced phase fluctuation is required for the signal light source and the local oscillator light source. As a characteristic value that is an index of the size of phase fluctuation, a spectral linewidth of laser emission light has been generally used. As the spectral linewidth of a light source used in the coherent communication is exemplified by using the index, the spectral linewidth is 500 kHz in 25-Gbaud quadrature phase-shift-keying (QPSK), and to achieve further multilevel modulation, the spectral linewidth of 300 kHz or less is desired. Further, the spectral linewidth changes with advancement of the multilevel modulation system, and in a modulation system having a high multilevel degree such as quadrature amplitude modulation (QAM), a narrower spectral linewidth is required.

It has been known that the spectral linewidth of the laser light emitted by a semiconductor laser device theoretically depends on optical power, threshold gain, linewidth-enhancement factor, and internal loss. In order to decrease the spectral linewidth of laser emission, it is important to design a resonator that decreases the threshold gain in an emission mode.

As a structure of a single-mode emission semiconductor laser device, a distributed reflector (DR) semiconductor laser device has been generalized in addition to a distributed feedback (DFB) semiconductor laser device, which has been frequently used in the past. In a simple term, the DR semiconductor laser device has a structure in which a DBR mirror is provided at the rear of the DFB semiconductor laser device, to reduce the threshold gain in the emission mode by reflection from the rear DBR mirror. The low threshold gain in the DR semiconductor laser device is preferable for a semiconductor laser device for coherent communication in which a narrow spectral linewidth is required (for example, see Japanese Patent Publication No. 5795126).

On the other hand, even in the case of the DR semiconductor laser device, it is preferable to introduce a phase shift structure for the single-mode emission, as in the DFB semiconductor laser device. The structure is referred to as "λ/4 shift" or "π shift", which is for obtaining laser emission in the wavelength at the center of a stopband by inserting a phase shift of a length half the period of a diffraction grating into near the center of the semiconductor laser device. By introducing the phase shift structure, laser power is distributed so as to attenuate in an exponential manner in directions away from the phase shift position.

In the case of the DR semiconductor laser device, the exponential distribution exhibits sharp attenuation as a coupling coefficient in the DFB portion becomes large, as in the DFB semiconductor laser device. If the exponential distribution is sharp, light is strongly confined in the laser resonator, and thus the threshold gain decreases. Therefore, it is preferable that the coupling coefficient is high in order to narrow the spectral linewidth. However, in the DR semiconductor laser device, it becomes difficult to obtain the single-mode emission when the coupling coefficient is designed to be larger in order to narrow the linewidth.

SUMMARY

The present disclosure, which has been made in view of the above, is directed to a semiconductor laser device.

According to an aspect of the present disclosure, a semiconductor laser device is provided which includes a distributed feedback portion serving as a light-emittable active region the distributed feedback portion having a diffraction grating; and a distributed reflective portion serving as a passive reflective mirror, the distributed reflective portion having a diffraction grating, wherein the distributed feedback portion includes a first region adjacent to the distributed reflective portion and having a diffraction grating having a predetermined standard period, a phase shift region adjacent to the first region, the phase shift region being longer by twice or more than the standard period, and a second region adjacent to an opposite side to the first region of the phase shift region and having a diffraction grating with the standard period, and the phase shift region optically changes a phase of laser beam between the first region and the second region.

The above and other objects, features, advantages and technical and industrial significance of this disclosure will be better understood by reading the following detailed description of presently preferred embodiment of the disclosure, when considered in connection with the accompanying drawings.

BRIEF DESCRIPTION OF THE DRAWINGS

FIG. 4 is a diagram illustrating an example of a combination;

DETAILED DESCRIPTION OF THE PREFERRED EMBODIMENTS

Embodiments of a semiconductor laser device according to the present disclosure will be explained in detail below with reference to the accompanying drawings. The present disclosure is not limited to the embodiments described below. In the respective drawings, like or corresponding constituent elements are denoted by like reference signs as appropriate. Note that the drawings are only schematic, and the thickness, the ratio of thickness, and the like of each layer are different from those of actual products. In addition, there is a case where portions differing in the relations or ratios of the dimensions among the drawings are included in the respective drawings.

Embodiment

Figure 1:
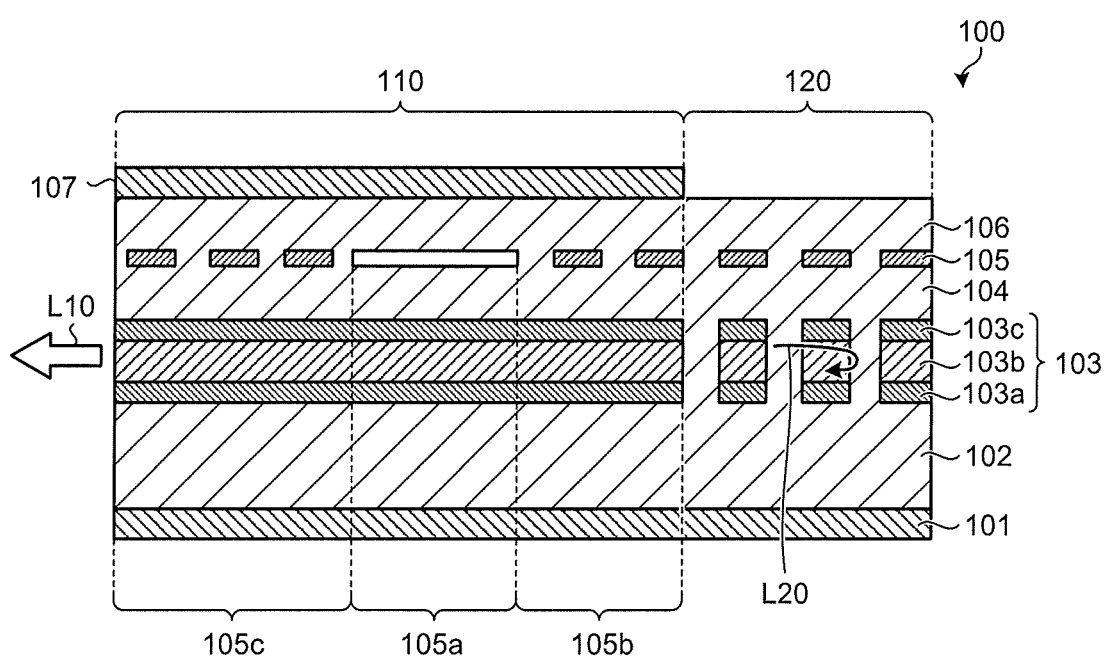
FIG. 1 is a schematic sectional view in which a semiconductor laser device according to an embodiment is cut along a lengthwise direction of an optical resonator.

FIG. 1 is a schematic sectional view in which a semiconductor laser device according to an embodiment of the present disclosure is cut along a lengthwise direction of an optical resonator. As illustrated in FIG. 1, a semiconductor laser device 100 includes an n-type semiconductor layer 102 with an n-side electrode 101 being formed on a back surface thereof, a waveguide core layer 103 formed on the n-type semiconductor layer 102, a p-type semiconductor layer 104 formed on the waveguide core layer 103, a diffraction grating layer 105 formed on the p-type semiconductor layer 104, a p-type semiconductor layer 106 formed on the diffraction grating layer 105, and a p-side electrode 107 formed on the p-type semiconductor layer 106. The n-type semiconductor layer 102, the waveguide core layer 103, the p-type semiconductor layer 104, the diffraction grating layer 105, and the p-type semiconductor layer 106 form a semiconductor layered structure.

Further, as illustrated in FIG. 1, the semiconductor laser device 100 includes a distributed-feedback laser portion 110 that is an active region emitting light and has the diffraction grating layer 105, and a distributed Bragg reflective portion 120 adjacent to the distributed-feedback laser portion 110, which is a passive reflective mirror and has the diffraction grating layer 105. An antireflection film (not illustrated) is formed on facets of the semiconductor layered structure (the facets on the left and right sides on the page). The semiconductor laser device according to the present disclosure can form a part of a semiconductor optical integrated device. In this case, a waveguide can be connected to any one or both facets of the device.

Furthermore, as illustrated in FIG. 1, the distributed-feedback laser portion 110 as a distributed-feedback portion includes a first region 105$b$ adjacent to the distributed Bragg reflective portion 120 as a distributed reflective portion and having a diffraction grating layer 105 with a predetermined period, a phase shift region 105$a$ adjacent to the first region 105$b$ and longer by twice or more than the period described above, and a second region 105$c$ adjacent to an opposite side to the first region 105$b$ of the phase shift region 105$a$ and having the diffraction grating layer 105 with the predetermined period.

The phase shift region 105$a$ is for optically changing the phase of laser beams between the first region 105$b$ and the second region 105$c$, and as described later in detail, can employ a configuration having a diffraction grating with a different period from that of the diffraction grating in the first region 105$b$ and the second region 105$c$, or a configuration having a region that does not include the diffraction grating. The phase shift region 105$a$ is for obtaining laser emission in a wavelength at the center of the stopband, as in a so-called "$\lambda/4$ shift" or "$\pi$ shift".

Respective constituent elements in the semiconductor layered structure are described here.

The n-type semiconductor layer 102 has a configuration in which an n-type InP cladding layer is formed on an n-type InP substrate.

The waveguide core layer 103 is made of GaInAsP and has an MQW-SCH structure including an MQW layer 103$b$ having a multi quantum well (MQW) structure including a plurality of barrier layers and a plurality of well layers, and separate confinement heterostructure (SCH) layers 103$a$ and 103$c$ arranged to put the MQW layer 103$b$ therebetween. The thickness of the MQW layer 103$b$ is, for example, from 40 nanometers to 60 nanometers, and the thickness of the SCH layers 103$a$ and 103$c$ is, for example, 30 nanometers. The waveguide core layer 103 may be an AlGaInAs waveguide core layer.

As illustrated in FIG. 1, the waveguide core layer 103 in the distributed-feedback laser portion 110 has a length continuous over the lengthwise direction of the optical resonator (hereinafter, the length refers to a dimension in the lengthwise direction of the optical resonator). On the other hand, the waveguide core layers 103 in the distributed Bragg reflective portion 120 are arranged discretely and periodically to form a diffraction grating, and a semiconductor material same as the p-type semiconductor layer 104 fills gaps between the waveguide core layers 103.

The p-type semiconductor layer 104 is a cladding layer made of p-type InP. The thickness of the p-type semiconductor layer 104 is, for example, from 50 nanometers to 200 nanometers.

The diffraction grating layer 105 has a configuration in which GaInAsP layers are arranged discretely with a predetermined period to form a diffraction grating, and an InP layer fills gaps between the GaInAsP layers. For example, the thickness of the diffraction grating layer 105 is from 5 nanometers to 50 nanometers, and more preferably from 15 nanometers to 30 nanometers. The diffraction grating layer 105 is arranged near the waveguide core layer 103 and along the waveguide core layer 103.

The p-type semiconductor layer 106 has a configuration in which a contact layer made of p-type GaInAsP is formed on a spacer layer made of p-type InP. The p-side electrode 107 is formed on the p-type semiconductor layer 106 in the distributed-feedback laser portion 110. The contact layer in the p-type semiconductor layer 106 has a function of reducing electric resistance against the p-side electrode 107.

Next, the operation of the semiconductor laser device 100 is described.

In the semiconductor laser device 100, a voltage is applied between the n-side electrode 101 and the p-side electrode 107 to inject a drive current. Because the p-side electrode 107 is formed on the p-type semiconductor layer 106 in the distributed-feedback laser portion 110, the drive current is injected into the waveguide core layer 103 in the distributed-feedback laser portion 110. The waveguide core layer 103 in the distributed-feedback laser portion 110, into which the drive current has been injected, functions as an active layer.

Because the distributed-feedback laser portion 110 has the diffraction grating layer 105 arranged near the waveguide core layer 103 and along the waveguide core layer 103, upon injection of the drive current, the distributed-feedback laser portion 110 performs laser emission with a wavelength corresponding to the period (twice the period) of the diffraction grating layer 105. Therefore, the period of the diffraction grating in the distributed-feedback laser portion 110 is set corresponding to the wavelength of the laser beams intended to be emitted, and in the following descriptions, the period is referred to as "standard period".

On the other hand, in the distributed Bragg reflective portion 120, because the waveguide core layers 103 are arranged discretely and periodically to form a diffraction grating, the distributed Bragg reflective portion 120 functions as a DBR mirror, and a laser beam L20 emitted by the distributed-feedback laser portion 110 are Bragg-reflected by the distributed Bragg reflective portion 120.

That is, the semiconductor laser device 100 functions as a DR semiconductor laser device, and outputs the laser beam L10 mainly only from the facet on the side of the distributed-feedback laser portion 110 (the facet on the left side on the drawing).

In the semiconductor laser device 100 having the configuration described above, because the waveguide core layer 103 itself constitutes a DBR mirror in the distributed Bragg reflective portion 120, a coupling coefficient κ of the diffraction grating formed by the waveguide core layer 103 can be increased.

Further, because the waveguide core layers 103 are discretely arranged in the distributed Bragg reflective portion 120, optical absorption is less than a case where the waveguide core layer 103 has a continuous length. As a result, a decrease in the optical power of the output laser beams L10 is suppressed.

As described above, the semiconductor laser device 100 has high optical power, high reliability, and excellent yield at the time of production, and can easily narrow the spectral linewidth. Therefore, the semiconductor laser device 100 is suitable as a signal light source in a communication system using, for example, a multilevel modulation system having a high bitrate.

Manufacturing Method

An example of a manufacturing method of the semiconductor laser device according to the present embodiment is described here. FIGS. 2A to 2D and FIGS. 3A to 3D are explanatory diagrams of the manufacturing method of the semiconductor laser device according to the present embodiment. A cross sections illustrated in FIGS. 2A to 2D and FIGS. 3A to 3D correspond to a cross section illustrated in FIG. 1.

Figure 2A:
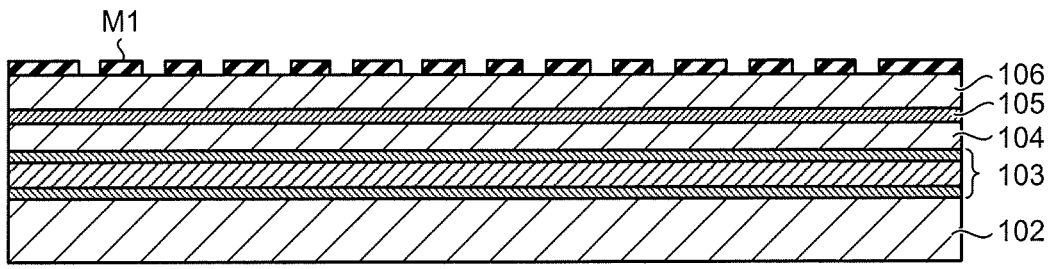
FIG. 2A is an explanatory diagram of a manufacturing method of the semiconductor laser device according to the embodiment.

First, a semiconductor layered-structure forming process for forming the semiconductor layered structure is described. The semiconductor layered structure has a region, which is to be the distributed-feedback laser portion 110, including the waveguide core layer 103 and the diffraction grating layer 105 arranged along the waveguide core layer 103, and a another region, which is to be the distributed Bragg reflective portion 120, including the waveguide core layers 103. As illustrated in FIG. 2A, the n-type semiconductor layer 102 is formed by forming a cladding layer made of n-type InP on a substrate made of n-type InP by using a crystal growth apparatus such as an MOCVD (Metal Organic Chemical Vapor Deposition) crystal growth apparatus. Further, the waveguide core layer 103, the p-type semiconductor layer 104, the diffraction grating layer 105, and the p-type semiconductor layer 106 are sequentially formed on the n-type semiconductor layer 102. However, at this time, the diffraction grating layer 105 is formed as a GaInAsP layer having no diffraction grating structure.

Next, a first etching process is described in which the diffraction grating layer 105 in a region that is to be the distributed-feedback laser portion 110 is etched so as to have a discrete arrangement with a predetermined standard period. First, as illustrated in FIG. 2A, a mask M1 made of SiN is formed on the p-type semiconductor layer 106, for example, by depositing a SiN layer by a CVD (Chemical Vapor Deposition) method, and patterning the SiN layer into a predetermined mask pattern. In the patterning, a pattern corresponding to the diffraction grating in both the region that is to be the distributed-feedback laser portion 110 and the region that is to be the distributed Bragg reflective portion 120 is formed.

Figure 2B:
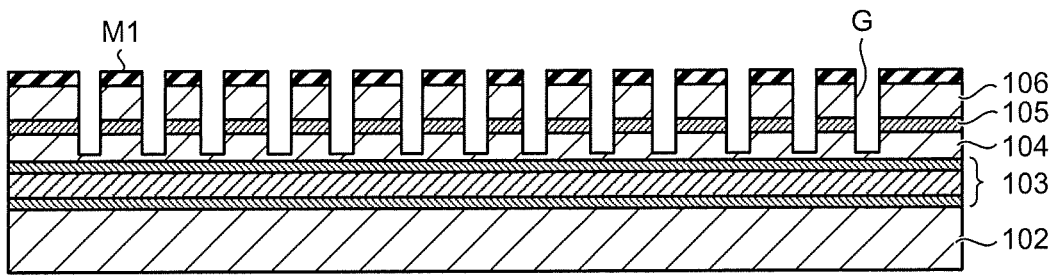
FIG. 2B is an explanatory diagram of the manufacturing method of the semiconductor laser device according to the embodiment.

Next, as illustrated in FIG. 2B, the semiconductor layered structure is etched so as to form grooves G, each of which has a depth reaching the p-type semiconductor layer 104 through the p-type semiconductor layer 106 and the diffraction grating layer 105, using the mask M1 as a mask, for example, by an ICP (Inductive Coupling Plasma)-RIE (Reactive Ion Etcher). Accordingly, the diffraction grating structure of the diffraction grating layer 105 is formed.

Figure 2C:
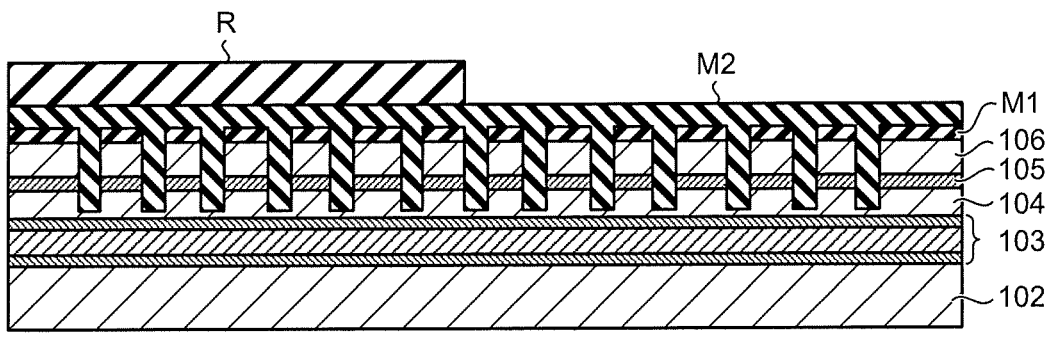
FIG. 2C is an explanatory diagram of the manufacturing method of the semiconductor laser device according to the embodiment.

Next, a second etching process in which the waveguide core layer 103 in the region that is to be the distributed Bragg reflective portion 120 of the semiconductor layered structure is etched to obtain a discrete arrangement with the predetermined standard period is described. First, as illustrated in FIG. 2C, a mask M2 is formed so as to fill the grooves G and cover the mask M1, and a resist film R is formed on the mask M2 in the region that is to be the distributed-feedback laser portion 110. The mask 2 is made of a material having an etching rate with respect to a predetermined etching solution different from that of the mask M1. The mask M2 may be formed of, for example, SiO$_2$ by, for example, a SOG (Spin On Glass) method. If the mask M2 is made of SiO$_2$, the mask M1 may be made of silicon or metal.

Figure 2D:
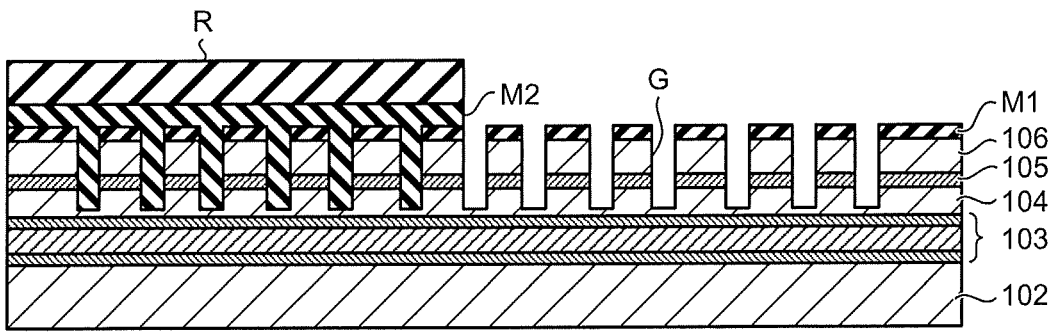
FIG. 2D is an explanatory diagram of the manufacturing method of the semiconductor laser device according to the embodiment.

Next, as illustrated in FIG. 2D, the resist film R is used as an etching mask, the mask M2 in the region that is to be the distributed Bragg reflective portion 120 is removed by a buffered hydrofluoric acid solution (BHF), to expose the grooves G. At this time, because the etching rate of the mask M2 with respect to the BHF is larger than that of the mask M1 with respect to the BHF, the mask M2 is selectively etched and the mask M1 remains.

Figure 3A:
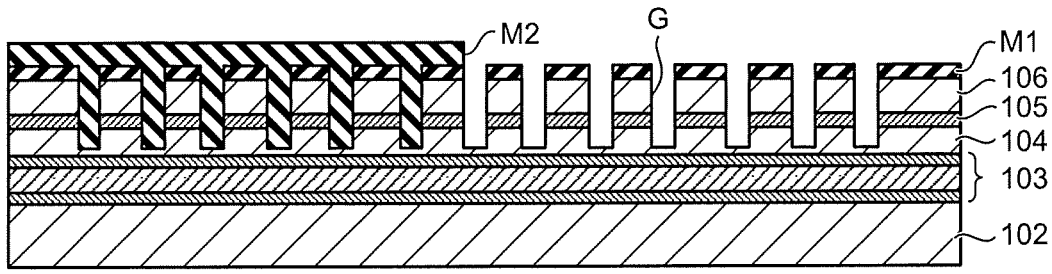
FIG. 3A is an explanatory diagram of the manufacturing method of the semiconductor laser device according to the embodiment.
Figure 3B:
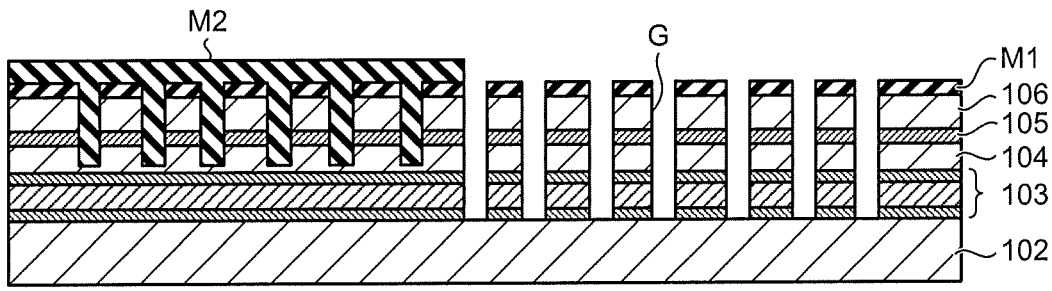
FIG. 3B is an explanatory diagram of the manufacturing method of the semiconductor laser device according to the embodiment.

Next, as illustrated in FIG. 3A, the resist film R is removed. Further, as illustrated in FIG. 3B, the grooves G are deeply etched further by the ICP-RIE up to a depth reaching a bottom surface of the waveguide core layer 103. As a result, in the region that is to be the distributed Bragg reflective portion 120, the waveguide core layer 103 is separated from each other by the grooves G, to form the diffraction grating structure in which the waveguide core layers 103 are arranged periodically. On the other hand, in the region that is to be the distributed-feedback laser portion 110, the waveguide core layer 103 still has a length continuous over the lengthwise direction of the optical resonator. That is, the second etching process is a process in which the mask M2 is formed on the outermost surface of the region that is to be the distributed-feedback laser portion 110 to protect the waveguide core layer 103 in the region that is to be the distributed-feedback laser portion 110 from etching in the second etching process.

In the distributed Bragg reflective portion 120, the diffraction grating layer 105 is not always required to be provided. However, because the diffraction grating layer 105 also contributes to the coupling coefficient κ in the distributed Bragg reflective portion 120, the diffraction grating layer 105 does not need to be particularly removed in the manufacturing process.

Figure 3C:
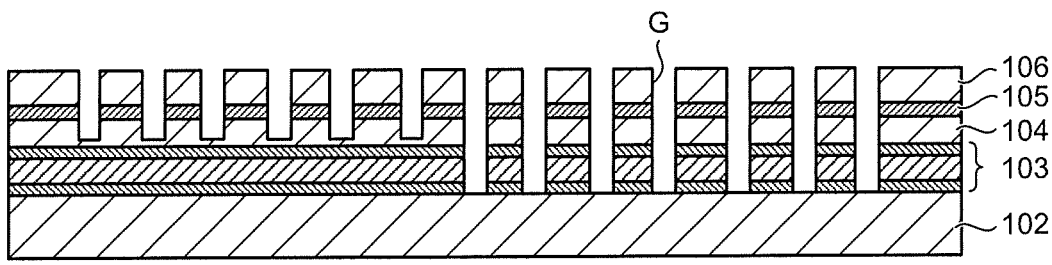
FIG. 3C is an explanatory diagram of the manufacturing method of the semiconductor laser device according to the embodiment.
Figure 3D:
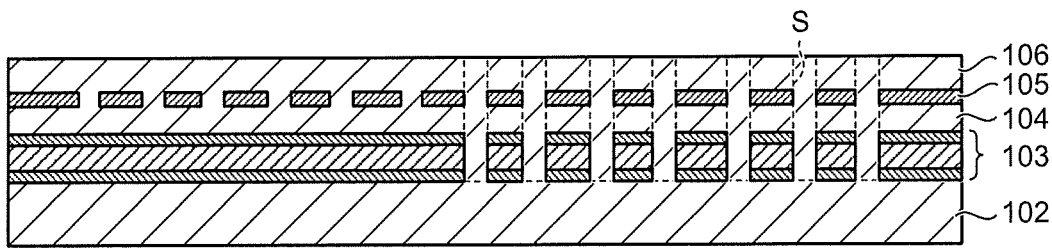
FIG. 3D is an explanatory diagram of the manufacturing method of the semiconductor laser device according to the embodiment.

Thereafter, as illustrated in FIG. 3C, the masks M1 and M2 are removed, and as illustrated in FIG. 3D, the grooves G are filled with a semiconductor material S, which is a semiconductor material same as that of the p-type semiconductor layer 104 by the crystal growth apparatus. Subsequently, necessary processes such as formation of a waveguide structure such as an embedded hetero-structure, formation of an upper cladding/contact layer, for example, formation of the p-side electrode 107 made of AuZn and the n-side electrode 101 having an AuGeNi/Au structure, formation of the antireflection film, and element separation are performed to complete the structure of the semiconductor laser device 100.

Design of Diffraction Grating

A design example of the diffraction grating in the semiconductor laser device 100 is described here. For comparison sake, design of the diffraction grating in the DFB semiconductor laser device is also described here.

In the DFB semiconductor laser device, if the λ/4 shift structure is used as a phase shift, light density is highest near the center where a shift position is located, and the light density decreases in directions away from the center. Therefore, stimulated emission frequently occurs near the center where the light density is high and injected carriers are consumed, thereby decreasing carrier density. This phenomenon is referred to as "(axial) spatial hole-burning". If the spatial hole-burning occurs, the gain decreases in a spot where desired light density is high, while the gain increases in a spot where the light density is low. If the distribution of gain is such that gain increases in a spot where light density is high for a different mode from a desired mode, laser emission is likely to occur at the different mode and the single-mode characteristics are deteriorated.

Further, in the λ/4 shift structure, because the amount of a phase shift is π, the emission mode occurs in a central wavelength of a stopband of the diffraction grating in the distributed feedback. If the phase shift amount is deviated from π, the mode is deviated from the center of the stopband. On the other hand, the effect of distributed feedback tends to be the strongest at the center of the stopband, and weaker away from the center.

If the spatial hole-burning occurs, a refractive index increases in a spot where the carrier density is low, and the refractive index decreases in a spot where the carrier density is high. If there is such a refractive index distribution, the effective phase shift amount changes depending on the refractive index distribution. In the case of the λ/4 shift structure, because the carrier density near the center where the phase shift occurs decreases and thus the refractive index increases, the effective phase shift amount increases. Subsequently, according to the property described above, if the spatial hole-burning occurs, the distributed feedback effect of the emission mode becomes weak and the threshold increases. On the other hand, the threshold in a side mode on the short wavelength side decreases, and thus a difference between the thresholds decreases and the single-mode characteristics are deteriorated.

According to such double effects, the spatial hole-burning causes deterioration in the single-mode characteristics. Therefore, a design for suppressing the spatial hole-burning in the DFB semiconductor laser device has been considered. An example thereof is a CPM (Corrugation Pitch Modulated) structure. In the CPM structure, the phase shift occurs in a certain region (hereinafter, PAR (Phase Arrangement Region)) in a distributed manner, rather than in one point in a concentrative manner. Therefore, the period of the diffraction grating in the region near the center of the DFB semiconductor laser device is set to be slightly different from the period (standard period) of the diffraction grating in other regions. Designing is performed so that the slight difference in the period between the regions becomes a desired phase shift as an accumulation of the entire PAR region. Although the light density decreases exponentially outside the PAR region, the light density has a smooth shape in the PAR region. Accordingly, the spatial distribution of the light density is decreased, and as a result, the spatial hole-burning is suppressed.

The PAR region is designed to have a length that generates an effect of decreasing the spatial distribution of the light density, in order to suppress the spatial hole-burning. The spatial distribution of the light density is generated in the order of a length of several tens micrometers. For example, if the length of the PAR region is set to a length 10.5 times the period of the diffraction grating, the length becomes about 2.5 micrometers. If the PAR region is such a considerably short region, even if the spatial distribution is decreased, it is not so effective because the region is smaller by one digit than the order of the length of spatial dependency of the light density. From this viewpoint, it is preferable to set the length of the effective PAR region to an order of 100 times or more the period of the diffraction grating.

As described above, by applying the CPM structure having the effect of suppressing the spatial hole-burning in the DFB semiconductor laser device also to the DR semiconductor laser device, it is expected to realize suppression of the spatial hole-burning and improvement of the single-mode characteristics even in the DR semiconductor laser device. However, it has not been considered how the structure should be designed in order to combine the suppression of the spatial hole-burning and the improvement of the single-mode characteristics. Design examples examined by the present inventors are described below. FIG. 4 is a diagram illustrating examples of the design examples.

As illustrated in FIG. 4, first, a configuration as in a first comparative example in which a rear standard period DFB region in an example of the DFB semiconductor laser device of a related art is replaced by a DBR region can be considered, as the CPM structure that may be applied to the DR semiconductor laser device. In this configuration, laser emission occurs due to reflection between a front standard period DFB region and a rear DBR region. However, in the configuration of the first comparative example, laser emission largely depends on the rear DBR region, and laser characteristics are largely affected by the reflection characteristics thereof.

Generally, in the DBR region being a passive portion, because the waveguide structure thereof is different from that of the standard period DFB region being an active region, it is difficult to match the refractive indexes thereof with each other completely. Therefore, if the refractive index is deviated due to a manufacturing error, the reflectivity in the DBR region may decrease. The influence due to such a deviation similarly acts on the carrier density at the time of performing current injection and a change of the refractive index due to heat generation. Other than the deviation of the refractive index, if there is scattering loss in a portion in the DBR region, the reflectivity decreases. If the reflectivity in the DBR region decreases due to these factors, the characteristics noticeably are deteriorated in the configuration of the first comparative example in which laser emission largely depends on only the reflectivity in the DBR region.

The inventors of the present disclosure devised the configurations of first to fourth embodiments illustrated in FIG. 4. Respective configurations of a semiconductor laser device according to the first to fourth examples are specifically described below.

First Example

A configuration of a semiconductor laser device according to a first example is such that a DBR region is added at the rear of the configuration of the conventional example in the DFB semiconductor laser device. According to this configuration, laser emission is possible by reflection between a front standard period DFB region and a rear standard period DFB region, as in the DFB semiconductor laser device. Further, a decrease in an emission threshold can be achieved due to reflection in the rear DBR region. With this configuration, because the rear standard period DFB region and DBR region both bear a function of rear reflection, a characteristic change due to a decrease in the reflectivity in the DBR region, which is a problem in the first comparative example, decreases considerably. Further, also in the DR semiconductor laser device having this configuration, an effect of decreasing the spatial hole-burning by the CPM structure can be acquired.

Figure 5:
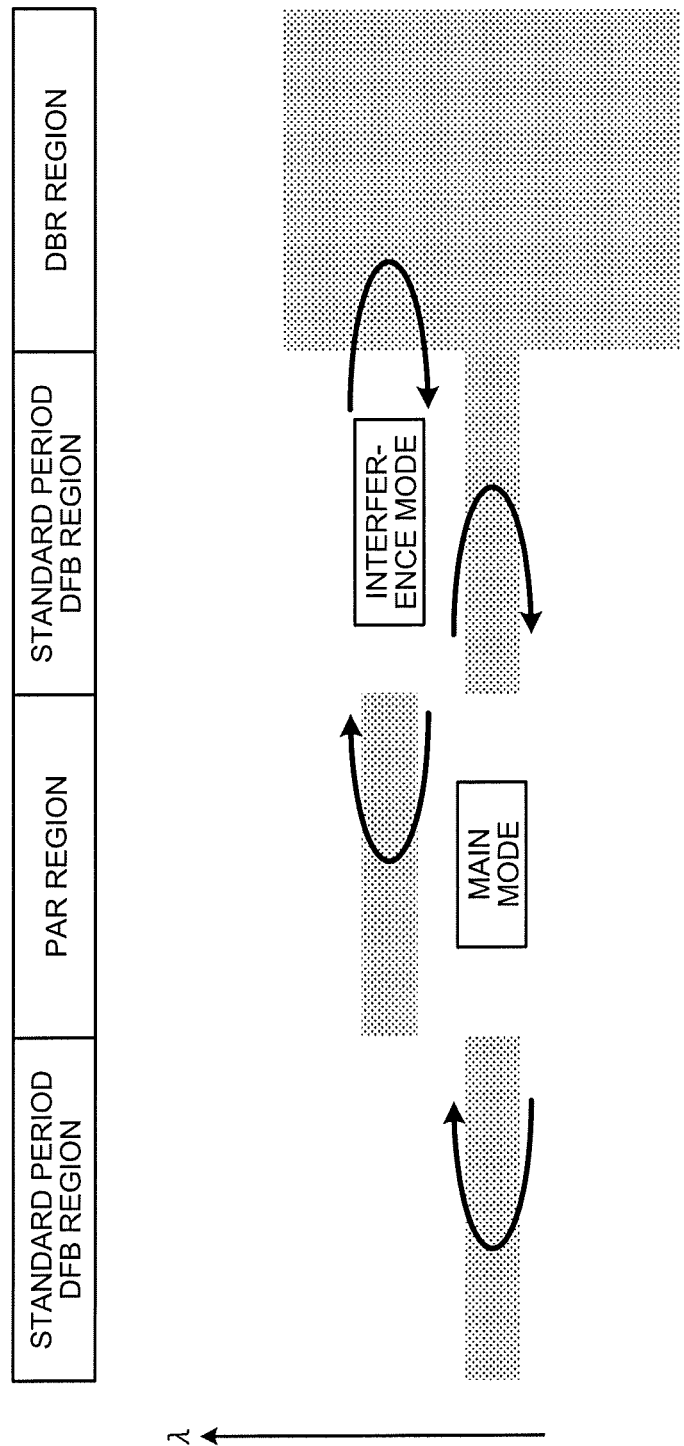
FIG. 5 is a diagram schematically illustrating a stopband in each region in a semiconductor laser device according to a first example.

FIG. 5 is a diagram schematically illustrating a stopband in each region in the semiconductor laser device according to the first example. In a structure having a diffraction grating as in the standard period DFB region and the DBR region, a wavelength band referred to as "stopband" in which light having a stopband wavelength can hardly propagate according to the period of the diffraction grating is formed, and light having the stopband wavelength is reflected. Hatched regions in FIG. 5 indicate the wavelength band of the stopband, and schematically illustrate that there are stopbands having wavelengths ($\lambda$) indicated by the vertical axis in each region illustrated in an upper part of FIG. 5.

In the DR semiconductor laser device, it is preferable to provide a configuration in which the coupling coefficient in the DBR region is increased to widen the stopband in order to increase the reflectivity in the DBR region and to cause the reflectivity to hardly decrease even if a difference in the refractive index is caused between the standard period DFB region and the DBR region. Therefore, as illustrated in FIG. 5, the stopband in the DBR region is designed to be wide. Further, as illustrated in FIG. 5, in the formation of the CPM structure, the period of the diffraction grating in the PAR region is made different from the standard period, so that the wavelength band of the stopband in the PAR region becomes different from the wavelength band of the stopband in the standard period DFB region.

According to the configuration of the stopband described above, a main mode intended to perform emission is formed in such a manner that the main mode is subjected to reflection due to the stopband in the front standard period DFB region and the stopband in the rear standard period DFB region, and reflection at the rear is further supported by the stopband in the DBR region.

Incidentally, because the emission mode is formed between stopbands in a plurality of regions, in the configuration of the first example, the emission mode is also formed in addition to the main mode, which is indicated as an interference mode in FIG. 5. Here, laser emission can occur at a wavelength different from that of the main mode laser emission between the stopbands in the standard period DFB regions due to reflection between a region between the stopband in the PAR region and the stopband in the DBR region.

An example of specific design values of the semiconductor laser device according to the first example is disclosed here. However, the values disclosed below are examples only, and the present disclosure is not limited to the values. For example, the scope of the present disclosure does not change even if an appropriate correction such as scaling of all the periods is added thereto according to a desired wavelength.

For example, the standard period is assumed to be 240 nanometers. At this time, the period of the diffraction grating in the PAR region is 240.2 nanometers, and if it is assumed that the length of the PAR region is 1800 periods of the diffraction grating, the length of the PAR region is about 432 micrometers. The length of the front standard period DFB region is about 310 micrometers, and the length of the rear standard period DFB region is also about 310 micrometers. Because the refractive index of the DBR region is lower than that of the standard period DFB region, the DBR period is 241 nanometers and the length of the DBR region is about 150 micrometers. The coupling coefficient in the respective standard period DFB regions is 20 $cm^{-1}$, and the coupling coefficient in the DBR region is 100 $cm^{-1}$.

Figure 6:
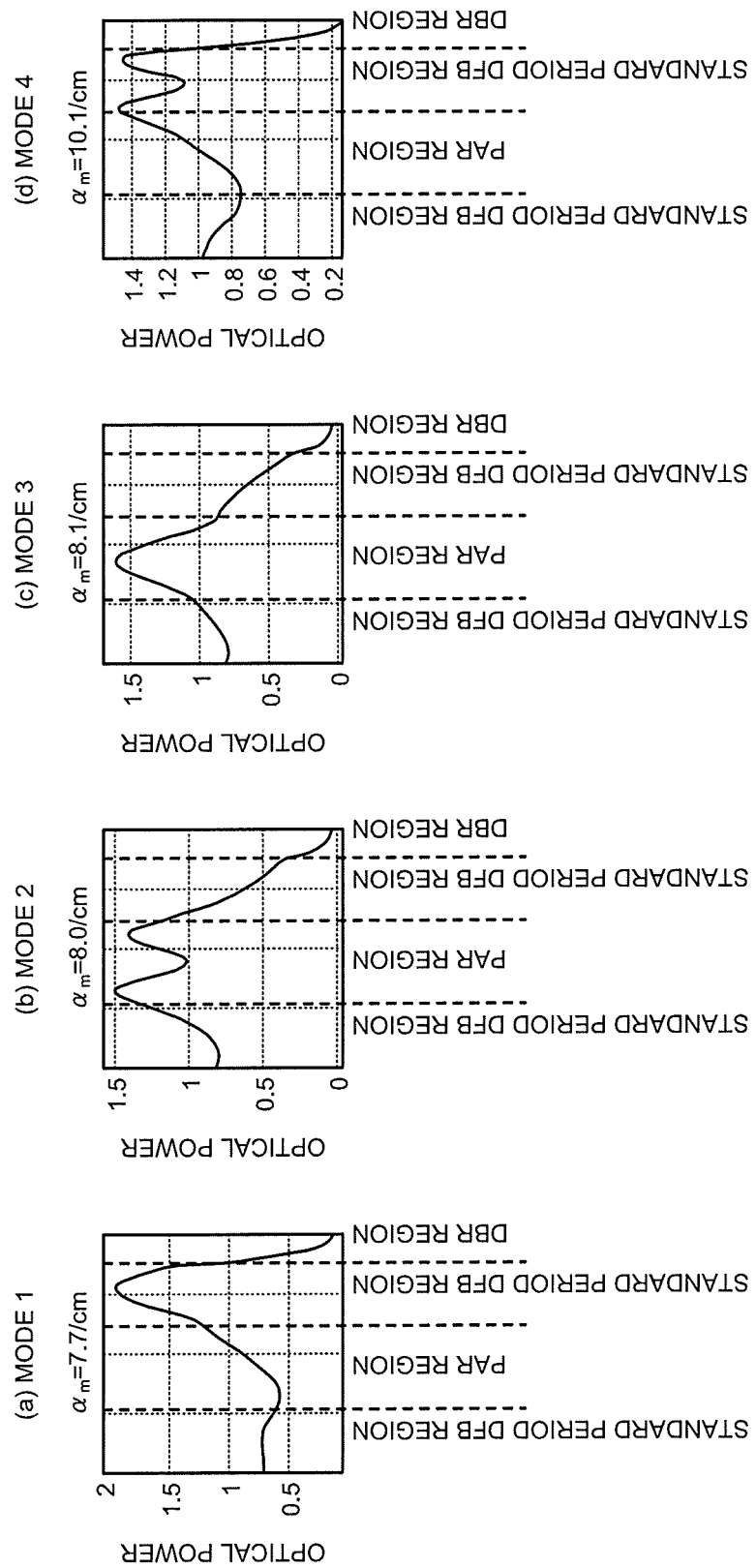
FIG. 6 is a diagram illustrating a result of calculating modes of emission candidates regarding the semiconductor laser device according to the first example.

FIG. 6 is a diagram illustrating a result of calculating the modes of emission candidates regarding the semiconductor laser device according to the first example. In FIG. 6, four modes (a) to (d) as the candidates of the emission mode in the semiconductor laser device having the design values described above are illustrated in ascending order of mirror loss $\alpha_m$. The mirror loss $\alpha_m$ corresponds to emission threshold gain, and in FIG. 6, the modes of the emission candidates are illustrated in order of higher to lower degree of likelihood of laser emission from the left. In the respective graphs (a) to (d) illustrated in FIG. 6, a position in a resonator direction in the semiconductor laser device is plotted on the horizontal axis and an optical power of the emission mode is plotted on the vertical axis.

As illustrated in FIG. 6, in the semiconductor laser device according to the first example, the mirror loss $\alpha_m$ in (a) mode 1 is lowest, and the laser emission is more likely to occur in this mode. Further, as is seen in the graph of (a) mode 1, it is understood that the optical power is highest in the rear standard period DFB region in this mode, which is the interference mode. On the other hand, in (b) mode 2 where the mirror loss $\alpha_m$ is next lowest, it is understood that the optical power is highest in the PAR region, and thus the mode is the main mode described above. Similarly, (c) mode 3 is the main mode and (d) mode 4 is the interference mode.

As described above, as illustrated in FIG. 6, in the semiconductor laser device according to the first example, according to the calculation, the interference mode is likely to occur than the main mode which is intended to occur. However, the mirror loss in the two modes is close to each other. Therefore, the mirror loss in the two modes can be easily reversed in an actually manufactured semiconductor laser device. In the actual semiconductor laser device, scattering loss is generally present between the DFB region and the DBR region. If there is loss in a boundary region thereof, the mirror loss increases in the interference mode in which the back reflection depends on only the DBR region, while in the main mode in which both the DFB region and the DBR region bear the back reflection, the mirror loss hardly changes. Therefore, in the semiconductor laser device according to the first example, the single mode emission in the main mode can be acquired with a certain yield. Further, when the semiconductor laser device according to the first example is to be used, by making a separate device such as suppressing the coupling coefficient in the DBR region, the single mode emission can be more easily acquired.

Second Example

A configuration of a semiconductor laser device according to a second example is such that a DBR region is added at the rear of the configuration of the conventional example in the DFB semiconductor laser device, and has substantially the similar configuration to that of the semiconductor laser device according to the first example. However, the length of the rear standard period DFB region is shorter than the length of the front standard period DFB region in the second example. The semiconductor laser device according to the second example can suppress emission in the interference mode with the configuration, and only the main mode can occur favorably.

The interference mode is likely to cause a problem particularly if the coupling coefficient in the DBR region is large and the stopband is wide. It is because the stopband in the DBR region expands up to a wavelength band different from the main mode. If the coupling coefficient in the DBR region is large, there is an advantage that even if a difference in the refractive index occurs between the standard period DFB region in which current injection is performed by heat generation and the DBR region, stable reflection can be maintained, in addition that even a small DBR region can increase the reflectivity. That is, suppression of emission in the interference mode means that the coupling coefficient in the DBR region can be increased, and resistance properties against heat generation associated with current injection can be enhanced, and thus the merit thereof is large.

Figure 7:
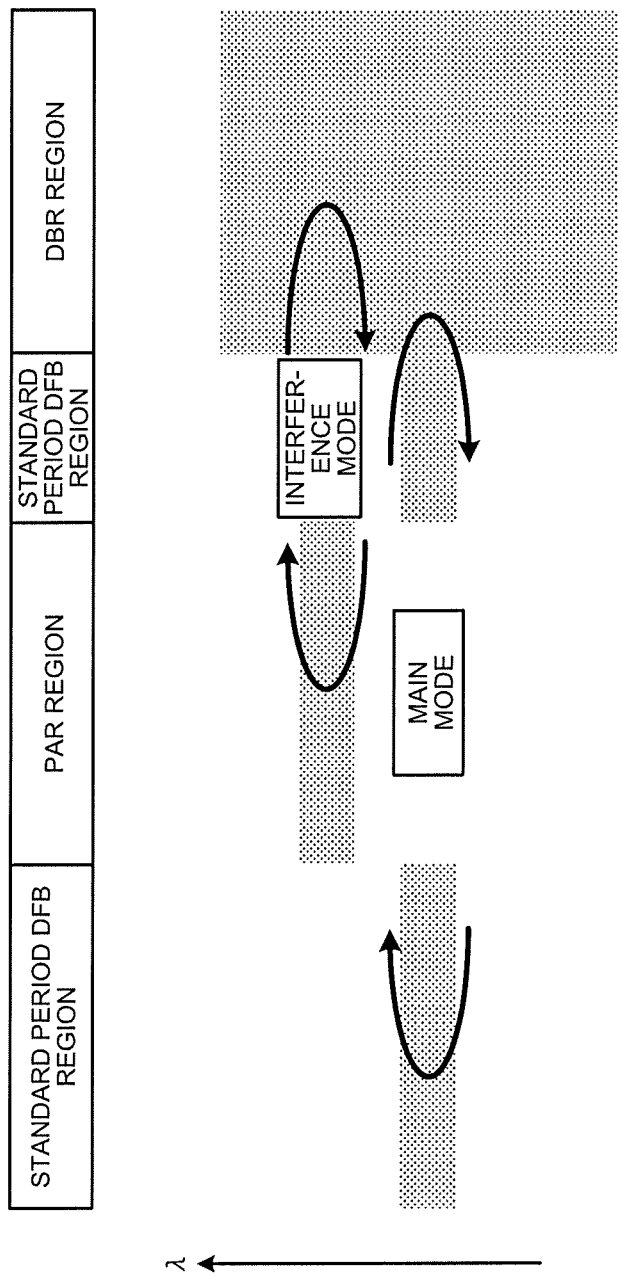
FIG. 7 is a diagram schematically illustrating a stopband in each region in a semiconductor laser device according to a second example.

FIG. 7 is a diagram schematically illustrating a stopband in each region in the semiconductor laser device according to the second example. A hatched region in FIG. 7 also indicates a wavelength band of the stopband as in FIG. 5, and schematically illustrate that there are stopbands having the wavelengths ($\lambda$) indicated by the vertical axis in each region illustrated at an upper part of FIG. 7.

The reason why emission in the interference mode can be suppressed in the configuration of the semiconductor laser device according to the second example is as described below. As illustrated in FIG. 7, in the configuration of the semiconductor laser device according to the second example, the length of the rear standard period DFB region is shorter than that of the front standard period DFB region. Here, when attention is paid to the fact that laser lights are amplified by the gain in the region between the two stopbands, it is understood that if the region is short, the mode generated in the region is hard to receive the gain. Therefore, in the configuration of the semiconductor laser device according to the second example, because the length of the rear standard period DFB region is short, although there is a room for generating the interference mode, the emission threshold increases, and as a result, only the main mode tends to occur favorably.

An example of the specific design values of the semiconductor laser device according to the second example is disclosed here. However, the values disclosed below are examples only, and the present disclosure is not limited to the values. For example, the scope of the present disclosure does not change even if an appropriate correction such as scaling of all the periods is added thereto according to a desired wavelength.

For example, the standard period is assumed to be 240 nanometers. At this time, the period of the diffraction grating in the PAR region is 240.2 nanometers, and if it is assumed that the length of the PAR region is 1800 periods of the diffraction grating, the length of the PAR region is about 432 micrometers. The length of the front standard period DFB region is about 400 micrometers, and the length of the rear standard period DFB region is about 220 micrometers. Because the refractive index of the DBR region is lower than that of the standard period DFB region, the DBR period is 241 nanometers and the length of the DBR region is about 150 micrometers. The coupling coefficient in the respective standard period DFB regions is 20 cm$^{-1}$, and the coupling coefficient in the DBR region is 100 cm$^{-1}$.

Figure 8:
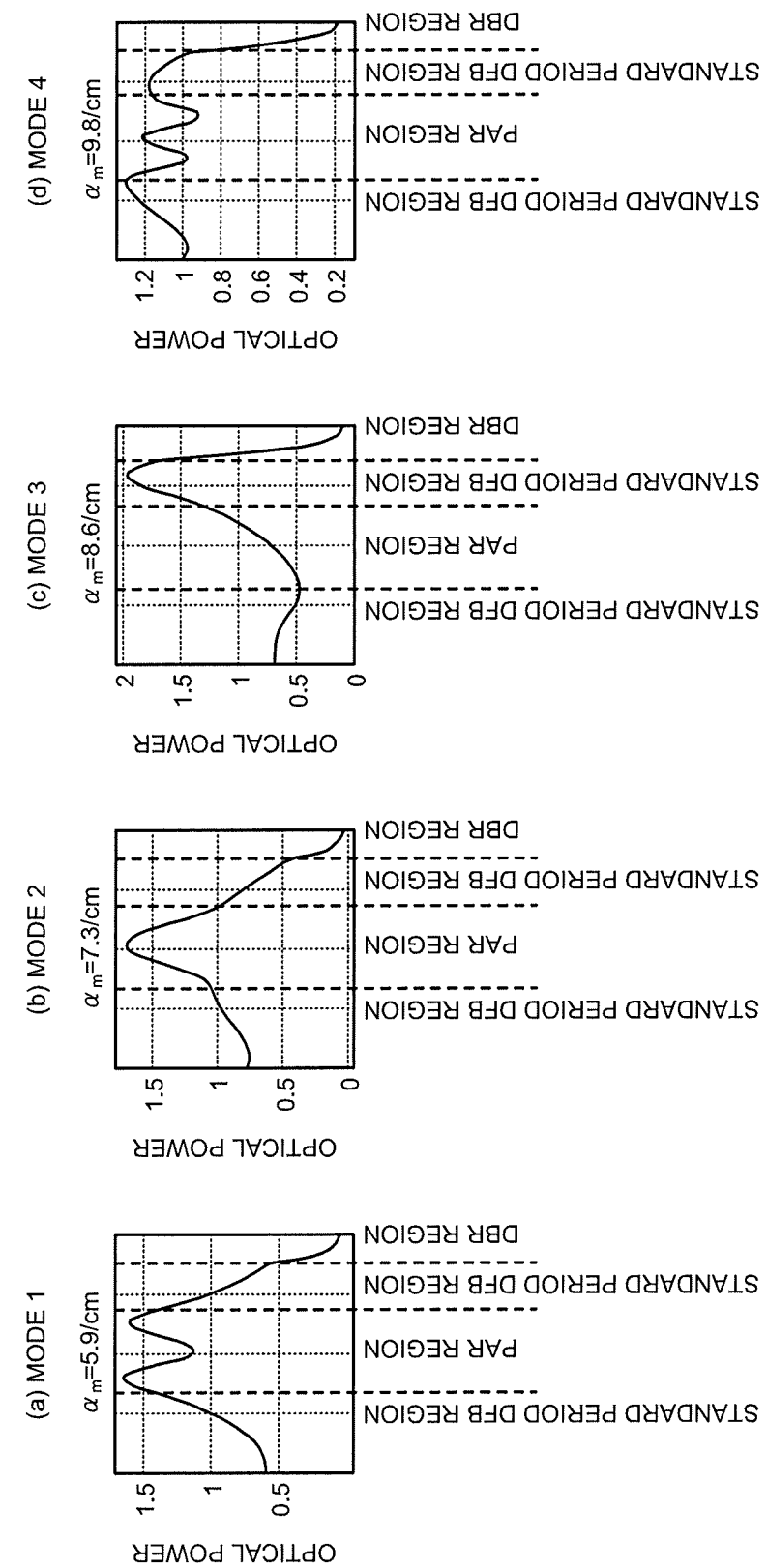
FIG. 8 is a diagram illustrating a result of calculating modes of emission candidates regarding the semiconductor laser device according to the second example.

FIG. 8 is a diagram illustrating a result of calculating the modes of emission candidates regarding the semiconductor laser device according to the second example. In FIG. 8, four modes (a) to (d) as the candidates of the emission mode in the semiconductor laser device having the design values described above are illustrated in ascending order of mirror loss $\alpha_m$. The modes of the emission candidates are illustrated in order of higher to lower degree of likelihood of laser emission from the left. In the respective graphs (a) to (d) illustrated in FIG. 8, the position in a resonator direction in the semiconductor laser device is plotted on the horizontal axis and the optical power of the emission mode is plotted on the vertical axis.

As illustrated in FIG. 8, in the semiconductor laser device according to the second example, the mirror loss $\alpha_m$ in (a) mode 1 is lowest, and the laser emission is more likely to occur in this mode. Further, as is seen in the graph of (a) mode 1, the optical power is highest in the PAR region in the mode, and the mode is the main mode intended to occur. On the other hand, in (b) mode 2 where the mirror loss $\alpha_m$ is next lowest, it is understood that the optical power is highest in the PAR region, and thus the mode is also the main mode. (C) mode 3 is the interference mode and (d) mode 4 is the main mode.

As described above, as illustrated in FIG. 8, in the semiconductor laser device according to the second example, there is a sufficient difference in the mirror loss $\alpha_m$ between the main mode and the interference mode, and the main mode intended to occur is noticeably likely to occur than the interference mode. That is, the semiconductor laser device according to the second example is a semiconductor laser device that has a small spectral linewidth due to the low threshold gain in the DR semiconductor laser device, suppresses the spectral hole-burning, and has excellent single-mode characteristics in which emission in the interference mode is suppressed.

Third Example

A configuration of a semiconductor laser device according to a third example has a configuration in which a region not including the diffraction grating is adopted as the phase shift region for optically changing the phase of laser beams between the front standard period DFB region and the rear standard period DFB region. That is, the configuration of the semiconductor laser device according to the third example is similar to the configuration of the semiconductor laser device according to the first example and the second example. However, instead of the PAR region, a region that does not include the diffraction grating is provided.

Figure 9:
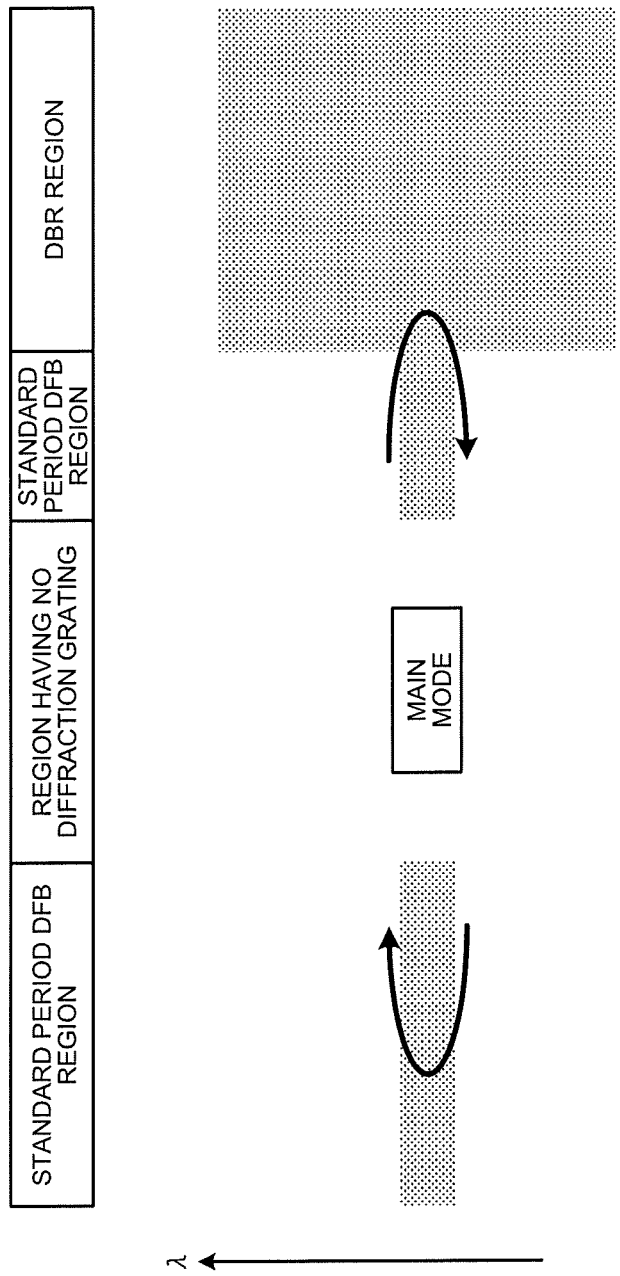
FIG. 9 is a diagram schematically illustrating a stopband in each region in a semiconductor laser device according to a third example.

FIG. 9 is a diagram schematically illustrating a stopband in each region in the semiconductor laser device according to the third example. Hatched region in FIG. 9 indicate a wavelength band of the stopband as in FIG. 5, and schematically illustrate that there are stopbands having the wavelengths (λ) indicated by the vertical axis in each region in an upper part of FIG. 9.

As illustrated in FIG. 9, in the semiconductor laser device according to the third example, the stopband that pairs with the DBR region to generate an interference mode is not present in the first place. Therefore, there is an advantage in that the interference mode does not occur. That is, the semiconductor laser device according to the third example is a semiconductor laser device that has a small spectral linewidth due to the low threshold gain in the DR semiconductor laser device, and has more excellent single-mode characteristics than a case of using the CPM structure.

A manufacturing method of the semiconductor laser device according to the third example is substantially similar to that described above. The only difference is that at the time of forming the diffraction grating, in the third example, patterning is performed so as to remove all portions corresponding to a region having no diffraction grating (the phase shift region 105a in FIG. 1). As a result, the phase shift region 105a in FIG. 1 is filled with the same semiconductor material as that of the p-type semiconductor layer 104.

The length of the region having no diffraction grating is set to be an odd multiple of the ¼ wavelength of the mode to be emitted. At this time, it is taken into consideration that the refractive index becomes slightly low because there is no diffraction grating layer. It is because in the standard period DFB region, a portion having the diffraction grating layer and a portion not having the diffraction grating layer alternately appear and thus the refractive index of the mode becomes an intermediate level between the both portions, but in the region having no diffraction grating, the refractive index is different because there is no diffraction grating.

Incidentally, the length of the region having no diffraction grating may not strictly coincide with an odd multiple of the ¼ wavelength of the mode to be emitted. If the length has a slightly shorter value than the strict value and the spatial hole-burning may slightly occur, which may relatively increase the refractive index of the region having no diffraction grating, excellent single-mode characteristics can be maintained.

An example of the specific design values of the semiconductor laser device according to the third example is disclosed here. However, the values disclosed below are examples only, and the present disclosure is not limited to the values. For example, the scope of the present disclosure does not change even if an appropriate correction such as scaling of all the periods is added thereto according to a desired wavelength.

For example, the standard period is assumed to be 240 nanometers. At this time, the length of the region having no diffraction grating is about 432 micrometers, and as described above, is set to be an odd multiple of the ¼ wavelength of the mode to be emitted. The length of the front standard period DFB region is about 400 micrometers, and the length of the rear standard period DFB region is about 220 micrometers. Because the refractive index of the DBR region is lower than that of the standard period DFB region, the DBR period is 241 nanometers and the length of the DBR region is about 150 micrometers. The coupling coefficient in the respective standard period DFB regions is 20 cm$^{-1}$, and the coupling coefficient in the DBR region is 100 cm$^{-1}$.

Figure 10:
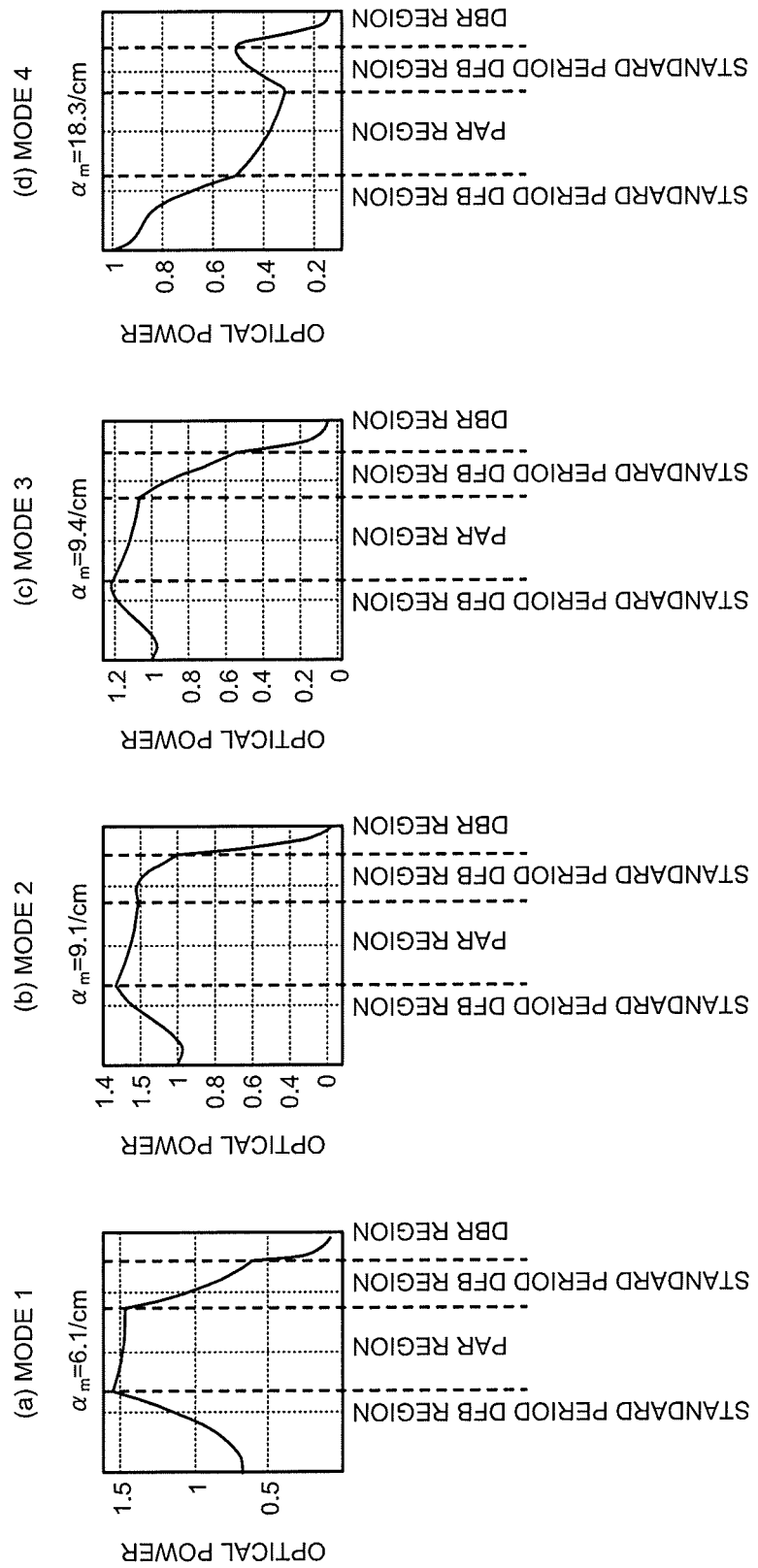
FIG. 10 is a diagram illustrating a result of calculating modes of emission candidates regarding the semiconductor laser device according to the third example.

FIG. 10 is a diagram illustrating a result of calculating the modes of emission candidates regarding the semiconductor laser device according to the third example. In FIG. 10, four modes (a) to (d) as the candidates of the emission mode in the semiconductor laser device having the design values described above are illustrated in ascending order of mirror loss $\alpha_m$. The modes of emission candidates are illustrated in order of higher to lower degree of likelihood of laser emission from the left. In the respective graphs (a) to (d) illustrated in FIG. 10, the position in a resonator direction in the semiconductor laser device is plotted on the horizontal axis and the optical power of the emission mode is plotted on the vertical axis.

As illustrated in FIG. 10, in the semiconductor laser device according to the third example, the mirror loss $\alpha_m$ in (a) mode 1 is lowest, and the laser emission is more likely to occur in this mode. Further, as is seen in the graph of (a) mode 1, the optical power is highest in the PAR region, and the mode is the main mode intended to occur. In all graphs (a) to (d) illustrated in FIG. 10, because a mode having strong optical power is not present in the rear standard period DFB region, it is also seen that in the semiconductor laser device according to the third example, the interference mode has not occurred.

Fourth Example

A configuration of a semiconductor laser device according to a fourth example is different from that of the second example in that the period of the diffraction grating in the PAR region largely is deviated from the standard period. That is, the period of the diffraction grating in the PAR region is set to be a period corresponding to the wavelength outside the reflection wavelength band in the DBR region. Specifically, the stopband in the PAR region is set to be outside the reflection band of the DBR region. The reflection band of the DBR region is a wavelength band in which, for example, the reflectivity is within 50% of a maximum value. With this configuration, the semiconductor laser device according to the fourth example is in a state where there is no interference mode, and thus only the main mode intended to occur can occur favorably.

Further, in the configuration of the semiconductor laser device according to the fourth example, an effective refractive index is different from each other between the PAR region and the standard period DFB region. This is because in the standard period DFB region, the portion having the diffraction grating layer and the portion having no diffraction grating layer alternately appear, and thus the refractive index of the mode becomes an intermediate level between the portion having the diffraction grating layer and the portion having no diffraction grating layer, and the PAR region has a refractive index of the portion having no diffraction grating layer. Accordingly, the phase shift amount in the PAR region depends on a difference in the refractive index between the standard period DFB region and the PAR region, and may be affected by production tolerance such as a width of the waveguide and a duty ratio of the diffraction grating.

Figure 11:
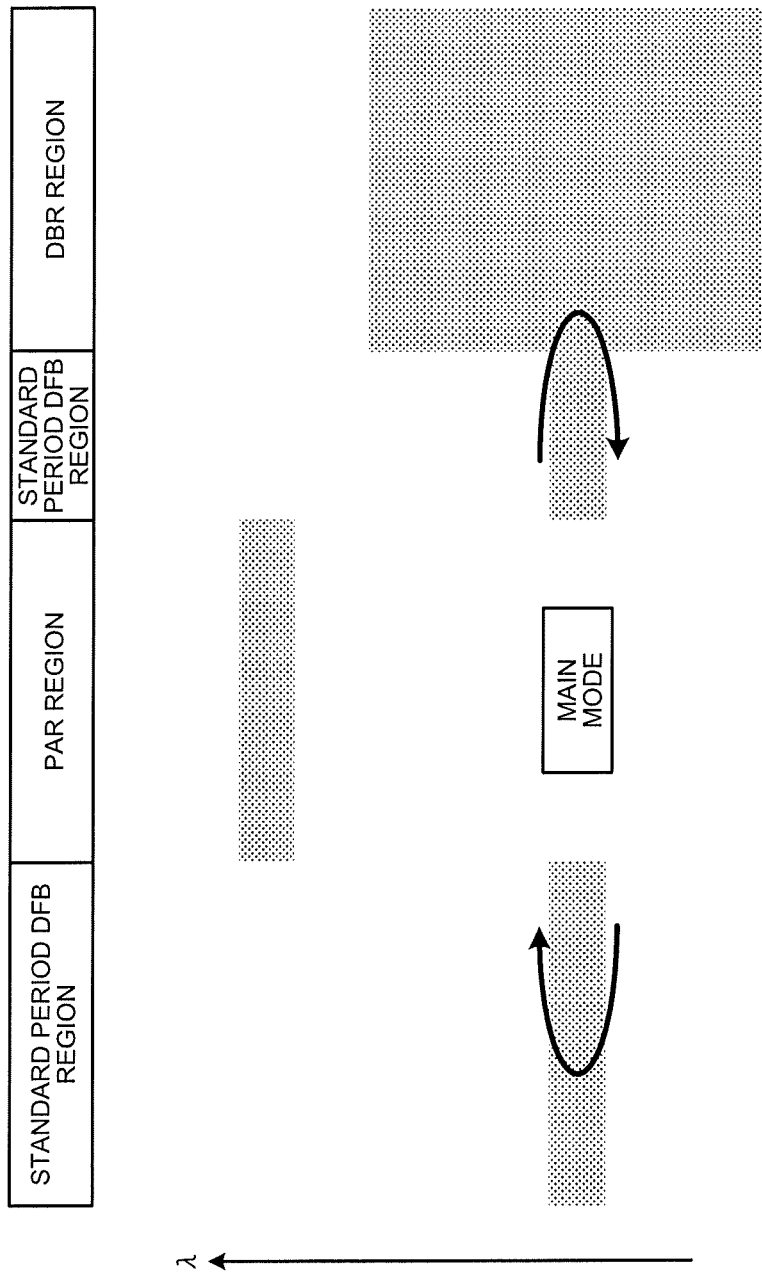
FIG. 11 is a diagram schematically illustrating a stopband in each region in a semiconductor laser device according to a fourth example.

FIG. 11 is a diagram schematically illustrating a stopband in each region in the semiconductor laser device according to the fourth example. Hatched regions in FIG. 11 indicate wavelength bands of the stopbands as in FIG. 5, and schematically illustrate that there are stopbands having the wavelengths ($\lambda$) indicated by the vertical axis in each region in an upper part of FIG. 11.

In the configuration of the semiconductor laser device according to the fourth example, the reason why emission in the interference mode can be suppressed is as described below. As illustrated in FIG. 11, in the configuration of the semiconductor laser device according to the fourth example, the period in the PAR region is shifted from the standard period. The period in the PAR region may be increased or decreased with respect to the standard period. Accordingly, the central wavelength of the stopband in the PAR region is largely shifted to a long wavelength side or a short wavelength side with respect to the stopband in the standard period DFB region, thereby enabling to arrange the stopband in the PAR region to the outside of the reflection band of the DBR region. In order to arrange the stopband in the PAR region to the outside of the reflection band of the DBR region, it is preferable to set the period in the PAR region to a period shifted by 1% or more with respect to the standard period. With this configuration, because there is no stopband that pairs with the stopband in the PAR region to generate an interference mode in the reflection band of the DBR region, the interference mode does not occur. That is, in the configuration of the semiconductor laser device according to the fourth example, not only the similar effect to that of the third example can be acquired, but also because the diffraction grating is provided also in the PAR region, the effective refractive index of the standard period DFB region and the effective refractive index of the PAR region become the same, and the phase shift amount controlled more precisely can be realized without being affected by the production tolerance.

An example of specific design values of the semiconductor laser device according to the fourth example is disclosed here. However, the values disclosed below are examples only, and the present disclosure is not limited to the values. For example, the scope of the present disclosure does not change even if an appropriate correction such as scaling of all the periods is added thereto according to a desired wavelength.

For example, the standard period is assumed to be 240 nanometers. At this time, the period of the diffraction grating in the PAR region is 244.8 nanometers, and if it is assumed that the length of the PAR region is 1765 periods of the diffraction grating, the length of the PAR region is about 432 micrometers. The length of the front standard period DFB region is about 400 micrometers, and the length of the rear standard period DFB region is about 220 micrometers. Because the refractive index of the DBR region is lower than that of the standard period DFB region, the DBR period is 241 nanometers and the length of the DBR region is about 150 micrometers. The coupling coefficient in the respective standard period DFB regions is 20 $cm^{-1}$, and the coupling coefficient in the DBR region is 100 $cm^{-1}$.

In the semiconductor laser device according to the fourth example, the reflection band of the DBR region is about 20 nanometers, and the period of the PAR region is increased by 2% with respect to the standard period. Therefore, the central wavelength of the stopband in the PAR region is shifted by 30 nanometers to the long wavelength side with respect to the stopband in the standard period DFB region, and is outside the reflection band of the DBR region. The example in which the stopband in the PAR region is shifted to the long wavelength side with respect to the reflection band of the DBR region by increasing the period in the PAR region with respect to the standard period is illustrated here. However, the stopband in the PAR region may be shifted to the short wavelength side with respect to the reflection band of the DBR region by decreasing the period in the PAR region with respect to the standard period.

Figure 12:
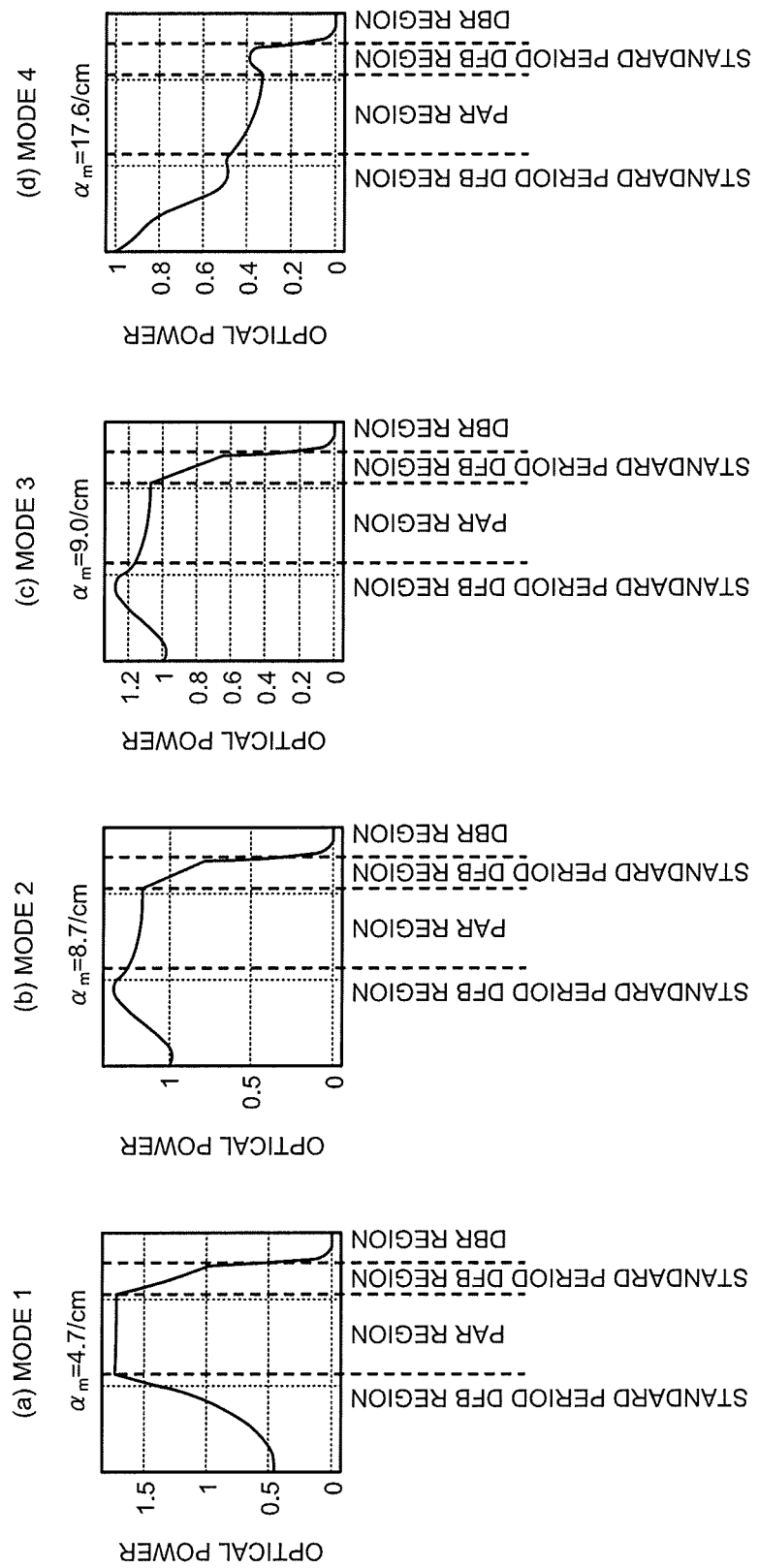
FIG. 12 is a diagram illustrating a result of calculating modes of emission candidates regarding the semiconductor laser device according to the fourth example.

FIG. 12 is a diagram illustrating a result of calculating the modes of emission candidates regarding the semiconductor laser device according to the fourth example. In FIG. 12, four modes (a) to (d) as the candidates of the emission mode in the semiconductor laser device having the design values described above are illustrated in ascending order of mirror loss $\alpha_m$. The modes of the emission candidates are illustrated in order of higher to lower degree of likelihood of laser emission from the left. In the respective graphs (a) to (d) illustrated in FIG. 12, the position in a resonator direction in the semiconductor laser device is plotted on the horizontal axis and the optical power of the emission mode is plotted on the vertical axis.

As illustrated in FIG. 12, in the semiconductor laser device according to the fourth example, the mirror loss $\alpha_m$ in (a) mode 1 is lowest, and the laser emission is more likely to occur in this mode. Further, as is seen in the graph of (a) mode 1, the optical power is highest in the PAR region in the mode, and the mode is the main mode intended to occur. In all the graphs (a) to (d) illustrated in FIG. 12, because there is no mode having strong optical power in the rear standard period DFB region, it is understood that an interference mode has not occurred in the semiconductor laser device according to the fourth example.

While the present disclosure has been explained above based on the embodiment and its examples, the disclosure is not limited thereto and those configured by appropriately combining the respective constituent elements described above are also included in the scope of the present disclosure. In addition, further effects and modifications can be easily derived by those skilled in the art. Therefore, extensive modes of the present disclosure are not limited to the above embodiment and various modifications can be made.

The semiconductor laser device according to the present disclosure has an effect that it has characteristics of a narrow spectral linewidth while maintaining excellent single-mode characteristics.

Although the disclosure has been described with respect to specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser device comprising:
a distributed feedback portion serving as a light-emittable active region, the distributed feedback portion having diffraction gratings; and
a distributed reflective portion serving as a passive reflective mirror, the distributed reflective portion having a first diffraction grating, wherein
the distributed feedback portion includes:
   a first region adjacent to the distributed reflective portion, the first region having a second diffraction grating, the second diffraction grating having a standard period,
   a phase shift region adjacent to the first region, a length of the phase shift region being longer by twice or more than the standard period, the phase shift region having a third diffraction grating, the third diffraction grating having a period different from the standard period, the period corresponding to a wavelength outside a reflection wavelength band of the passive reflective mirror, and
   a second region adjacent to an opposite side to the first region adjacent to the phase shift region, the second region having a fourth diffraction grating with the standard period, and
the phase shift region optically changes a phase of laser beam between the first region and the second region.

2. The semiconductor laser device according to claim 1, wherein the length of the phase shift region is 100 times or more of the standard period.

3. The semiconductor laser device according to claim 1, wherein a length of the first region is shorter than that of the second region.

4. The semiconductor laser device according to claim 1, wherein the period of the third diffraction grating in the phase shift region is a period shifted by 1% or more with respect to a period of the passive reflective mirror.

5. The semiconductor laser device according to claim 1, wherein a coupling coefficient of the first diffraction grating in the distributed reflective portion is larger than a coupling coefficient of the second diffraction grating in the first region and a coupling coefficient of the fourth diffraction grating in the second region of the distributed feedback portion.

* * * * *